US010062808B2

(12) United States Patent
Hyot et al.

(10) Patent No.: US 10,062,808 B2
(45) Date of Patent: Aug. 28, 2018

(54) OPTOELECTRONIC DEVICE WITH IMPROVED REFLECTIVITY

(71) Applicant: Commissariat à l'énergie atomique et aux énergies alternatives, Paris (FR)

(72) Inventors: Bérangère Hyot, Eybens (FR); Philippe Gilet, Teche (FR)

(73) Assignees: Commissariat à l'énergie atomique et aux énergies alternatives, Paris (FR); Aledia, Grenoble (FR)

( * ) Notice: Subject to any disclaimer, the term of this patent is extended or adjusted under 35 U.S.C. 154(b) by 0 days.

(21) Appl. No.: 14/901,214

(22) PCT Filed: Jun. 25, 2014

(86) PCT No.: PCT/FR2014/051591
§ 371 (c)(1),
(2) Date: Dec. 28, 2015

(87) PCT Pub. No.: WO2014/207378
PCT Pub. Date: Dec. 31, 2014

(65) Prior Publication Data
US 2016/0284938 A1   Sep. 29, 2016

(30) Foreign Application Priority Data

Jun. 25, 2013  (FR) ...................... 13 56059

(51) Int. Cl.
*H01L 33/00* (2010.01)
*H01L 33/24* (2010.01)
(Continued)

(52) U.S. Cl.
CPC .............. *H01L 33/24* (2013.01); *H01L 33/10* (2013.01); *H01L 33/18* (2013.01); *H01L 33/28* (2013.01);
(Continued)

(58) Field of Classification Search
CPC ......... H01L 33/24; H01L 33/10; H01L 33/18; H01L 33/28; H01L 33/32; H01L 33/405;
(Continued)

(56) References Cited

U.S. PATENT DOCUMENTS 8,350,251 B1 * 1/2013 Lowgren ................ H01L 33/06
257/13
2008/0149944 A1  6/2008 Samuelson et al.
(Continued)

FOREIGN PATENT DOCUMENTS

DE       102011056140 A1    6/2013

OTHER PUBLICATIONS

"International Search Report", dated Oct. 15, 2014, issued in counterpart International Application No. PCT/FR2014/051591 by EPO as International Searching Authority.
(Continued)

*Primary Examiner* — Caleb Henry
*Assistant Examiner* — Alexander Belousov
(74) *Attorney, Agent, or Firm* — Kaplan Breyer Schwarz, LLP (57) ABSTRACT

The invention concerns an optoelectronic device (40) comprising: a substrate (14); a first layer (42) covering the substrate, the first layer having a thickness greater than or equal to 15 nm and comprising a first material having an extinction coefficient greater than or equal to 3 for any wavelength between 380 and 650 nm; a second layer (18) covering and in contact with the first layer, the second layer having a thickness less than or equal to 20 nm and comprising a second material having a refraction index of between 1 and 3 and an extinction coefficient less than or equal to 1.5 or any wavelength between 380 and 650 nm; and conical or frustoconical wire semiconductor elements
(Continued)

(24) each having a light-emitting diode stack (DEL), being in contact with the second layer.

8 Claims, 3 Drawing Sheets

(51) Int. Cl.
*H01L 33/18* (2010.01)
*H01L 33/40* (2010.01)
*H01L 33/10* (2010.01)
*H01L 33/28* (2010.01)
*H01L 33/32* (2010.01)
*H01L 33/08* (2010.01)
*H01L 33/46* (2010.01)

(52) U.S. Cl.
CPC ............ *H01L 33/32* (2013.01); *H01L 33/405* (2013.01); *H01L 33/08* (2013.01); *H01L 33/46* (2013.01); *H01L 2933/0058* (2013.01)

(58) Field of Classification Search
CPC .. H01L 33/08; H01L 33/46; H01L 2933/0058
See application file for complete search history.

(56) References Cited

U.S. PATENT DOCUMENTS

| | | | |
|---|---|---|---|
| 2010/0127238 | A1 | 5/2010 | Kim et al. |
| 2015/0155331 | A1* | 6/2015 | Guenard ............... H01L 27/153 257/93 |

OTHER PUBLICATIONS

JDSU, "Mirrors, Coating Choice Makes a Difference", EDU.Photonics.com, Feb. 11, 2013, Publisher: Photonics Media; Retrieved online: http://www.photonics.com/edu/Handbook.aspx?AID=25501; XP055144933.

Hooper, et al, "Some considerations on the transmissivity of thin metal films", Optics Express, Oct. 27, 2008, pp. 17249-17257, vol. 16, No. 22, Publisher: Optical Society of America; retrieved online: https://newton.ex.ac.uk/research/emag/pubs/pdf/Hooper_OE_2008.pdf; XP55113795A.

E.F. Schubert, "Refractive index and extinction coefficient of materials", 2004, Publisher: RPInfo; Retrieved from: https://www.ecse.rpi.edu/~schubert/Educational-resources/Materials-Refractive-index-and-extinction-coefficient.pdf; XP55113489A.

"Written Opinion of International Searching Authority", dated Oct. 15, 2014, issued in counterpart International PCT Patent Application No. PCT/FR2014/051591.

* cited by examiner

OPTOELECTRONIC DEVICE WITH IMPROVED REFLECTIVITY

The present patent application claims the priority benefit of French patent application FR13/56059 which is herein incorporated by reference.

BACKGROUND

The present invention generally relates to optoelectronic devices based on semiconductor materials and to methods for manufacturing the same. The present invention more specifically relates to optoelectronic devices comprising light-emitting diodes formed by three-dimensional elements, particularly semiconductor microwires or nanowires.

DISCUSSION OF THE RELATED ART

Phrase "optoelectronic devices with light-emitting diodes" designates devices capable of converting an electric signal into an electromagnetic radiation, and particularly devices dedicated to emitting an electromagnetic radiation, particularly light. Examples of three-dimensional elements capable of forming light-emitting diodes are microwires or nanowires comprising a semiconductor material based on a compound mainly comprising at least one group-III element and one group-V element (for example, gallium nitride GaN), called III-V compound hereafter, or mainly comprising at least one group-II element and one group-VI element (for example, zinc oxide ZnO), called II-VI compound hereafter.

Three-dimensional elements, particularly semiconductor microwires or nanowires, are generally formed on a substrate and each three-dimensional element is at least partially covered with a semiconductor structure capable of emitting light. An observer sees the light emitted by the light-emitting diodes which escapes from the optoelectronic device. However, part of the light emitted by the light-emitting diodes is captured by the three-dimensional elements or by the substrate and is thus not seen by an observer. It would be desirable to increase the portion of the light emitted by the light-emitting diodes which succeeds in escaping from the optoelectronic device.

SUMMARY

An embodiment provides an optoelectronic device comprising:
a substrate;
light-emitting diodes comprising wire, conical, or frusto-conical semiconductor elements; and
a first layer or first portions covering the substrate and interposed between the substrate and the semiconductor elements, the first layer or the first portions having a thickness greater than or equal to 15 nm and comprising a first material having an extinction coefficient greater than or equal to 3 for a wavelength in the range from 380 nm to 650 nm.

According to an embodiment, the first material is selected from the group comprising chromium, rhodium, ruthenium, palladium, or an alloy of two of these compounds or of more than two of these compounds.

According to an embodiment, the optoelectronic device further comprises a second layer or second portions covering the first layer or the first portions, the light-emitting diodes being in contact with the second layer or the second portions.

According to an embodiment, the second layer or the second portions have a thickness smaller than or equal to 20 nm and comprise a second material having a refraction index in the range from 1 to 3 and an extinction coefficient smaller than or equal to 1.5 for a wavelength in the range from 380 nm to 650 nm.

According to an embodiment, the second material is selected from the group comprising a nitride, a carbide, or a boride of a transition metal of column IV, V, or VI of the periodic table of elements or a combination of these compounds.

According to an embodiment, the second material is selected from the group comprising aluminum nitride (AlN), boron (B), boron nitride (BN), titanium (Ti), titanium nitride (TiN), tantalum (Ta), tantalum nitride (TaN), hafnium (Hf), hafnium nitride (HfN), niobium (Nb), niobium nitride (NbN), zirconium (Zr), zirconium borate ($ZrB_2$), zirconium nitride (ZrN), silicon carbide (SiC), tantalum carbonitride (TaCN), magnesium nitride in $Mg_xN_y$ form, where x is approximately equal to 3 and y is approximately equal to 2, for example, magnesium nitride in $Mg_3N_2$ form or magnesium gallium nitride (MgGaN), tungsten (W), tungsten nitride (WN) or a combination of these compounds.

According to an embodiment, each semiconductor element comprises a microwire or a nanowire.

According to an embodiment, the substrate is made of a third semiconductor material selected from the group comprising silicon, germanium, silicon carbide, a III-V compound, a II-VI compound, and a combination of these compounds.

According to an embodiment, each semiconductor element comprises at least a portion mainly comprising a fourth semi-conductor material in contact with the second layer or one of the second portions, the fourth semiconductor material being selected from the group comprising silicon, germanium, silicon carbide, a III-V compound, a II-VI compound, and a combination of these compounds.

According to an embodiment, each semiconductor element is at least partially covered with a semiconductor structure capable of emitting light.

According to an embodiment, the optoelectronic device further comprises a third layer between the first layer or the first portions and the substrate.

According to an embodiment, the third layer and the second layer or the second portions are made of the same material.

BRIEF DESCRIPTION OF THE DRAWINGS

The foregoing and other features and advantages will be discussed in detail in the following non-limiting description of specific embodiments in connection with the accompanying drawings, among which.

DETAILED DESCRIPTION

For clarity, the same elements have been designated with the same reference numerals in the various drawings and, further, as usual in the representation of electronic circuits, the various drawings are not to scale. Further, only those elements which are useful to the understanding of the present description have been shown and will be described. In particular, the means for controlling the optoelectronic device described hereafter are within the abilities of those skilled in the art and are not described.

In the following description, unless otherwise indicated, terms "substantially", "approximately", and "in the order of" mean "to within 10%". Further, "compound mainly formed of a material" or "compound based on a material" means that a compound comprises a proportion greater than or equal to 95% of said material, this proportion being preferably greater than 99%. In the description and the claims, "for a wavelength in the range" means "for any wavelength in the range".

The present description relates to optoelectronic devices comprising three-dimensional elements, for example, microwires, nanowires, conical elements, or frustoconical elements. In the following description, embodiments are described for optoelectronic devices comprising microwires or nanowires. However, these embodiments may be implemented for three-dimensional elements other than microwires or nanowires, for example, pyramid-shaped three-dimensional elements.

Term "microwire" or "nanowire" designates a three-dimensional structure having an elongated shape along a preferred direction, having at least two dimensions, called minor dimensions, in the range from 5 nm to 2.5 µm, preferably from 50 nm to 2.5 µm, the third dimension, called major dimension, being at least equal to 1 time, preferably at least 5 times, and more preferably still at least 10 times, the largest minor dimension. In certain embodiments, the minor dimensions may be smaller than or equal to approximately 1 µm, preferably in the range from 100 nm to 1 µm, more preferably from 100 nm to 300 nm. In certain embodiments, the height of each microwire or nanowire may be greater than or equal to 500 nm, preferably in the range from 1 µm to 50 µm.

In the following description, term "wire" is used to mean "microwire or nanowire". Preferably, the median line of the wire which runs through the centers of gravity of the cross-sections, in planes perpendicular to the preferred direction of the wire, is substantially rectilinear and is called "axis" of the wire hereafter.

The cross-section of the wires may have different shapes, such as, for example, an oval, circular, or polygonal shape, particularly triangular, rectangular, square, or hexagonal. It should thus be understood that term "diameter" mentioned in relation with a cross-section of a wire or of a layer deposited on this wire designates a quantity associated with the surface area of the targeted structure in this cross-section, corresponding, for example, to the diameter of the disk having the same surface area as the wire cross-section.

The wires may at least partly be based on at least one semiconductor material. The semiconductor material may be silicon, germanium, silicon carbide, a III-V compound, a II-VI compound, or a combination of these compounds.

The wires may be at least partly formed of semiconductor materials mainly comprising a III-V compound, for example, III-N compounds. Examples of group-III elements comprise gallium (Ga), indium (In), or aluminum (Al). Examples of III-N compounds are GaN, AlN, InN, InGaN, AlGaN, or AlInGaN. Other group-V elements may also be used, for example, phosphorus or arsenic. Generally, the elements in the III-V compound may be combined with different molar fractions.

The wires may be at least partly formed based on semiconductor materials mainly comprising a II-VI compound. Examples of group-II elements comprise group-IIA elements, particularly beryllium (Be) and magnesium (Mg), and group-IIB elements, particularly zinc (Zn) and cadmium (Cd). Examples of group-VI elements comprise group-VIA elements, particularly oxygen (O) and tellurium (Te). Examples of II-VI compounds are ZnO, ZnMgO, CdZnO, or CdZnMgO. Generally, the elements in the II-VI compound may be combined with different molar fractions.

In certain embodiments, the wires may comprise a dopant. As an example, for III-V compounds, the dopant may be selected from the group comprising a group-II P-type dopant, for example, magnesium (Mg), zinc (Zn), cadmium (Cd), or mercury (Hg), a group-IV P-type dopant, for example, carbon (C), or a group-IV N-type dopant, for example, silicon (Si), germanium (Ge), selenium (Se), sulfur (S), terbium (Tb), or tin (Sn).

A seed layer is formed on a surface of a substrate. As a variation, pads or islands, also called seed islands hereafter, are formed on a surface of a substrate. The seed layer or the seed islands are made of a material favoring wire growth. In the case of seed islands, a treatment is further provided to protect the lateral sides of the seed islands and the surface of the substrate portions which are not covered with the seed islands to prevent the growth of wires on the lateral sides of the seed islands and on the surface of the substrate portions which are not covered with the seed islands. The treatment may comprise forming a dielectric region on the lateral sides of the seed islands and extending on top of and/or inside of the substrate and connecting, for each pair of islands, one of the islands in the pair to the other islands in the pair, with no wire growth on the dielectric region.

The substrate may correspond to a one-piece structure or correspond to a layer covering a support made of another material. The substrate for example is a semiconductor substrate such as a substrate made of silicon, germanium, silicon carbide, a III-V compound, such as GaN or GaAs, or a ZnO substrate. The substrate may be made of a conductive material, for example, of metal, or of an insulating material, for example, of sapphire, glass, or ceramic.

The fact of saying that a compound based on at least one first element and on a second element has a polarity of the first element and a polarity of the second element means that the material grows along a preferred direction and that when the material is cut in a plane perpendicular to the preferred growth direction, the exposed surface essentially comprises atoms of the first element in the case of the polarity of the first element or the atoms of the second element in the case of the polarity of the second element.

The material forming the seed layer or the seed islands is selected to favor the wire growth according to the same polarity. As an example, when the wires mainly comprise a III-V compound, the material forming the seed islands is preferably selected to favor the growth of the III-V compound according to polarity of the group-V element. The III-V compound then grows along the polarity of the group-V element on the seed layer or on the seed islands. Further, the inventors have shown that each wire then grows according to a substantially constant polarity in the entire wire. When the wires mainly comprise a II-VI compound, the material forming the seed layer or the seed islands is preferably selected to favor the growth of the II-VI compound according to the polarity of the group-VI element. The II-VI compound then grows according to the polarity of the group-VI element on the seed layer or on the seed islands. In the case of a III-V compound where the group-V element is nitrogen, the material forming the seed layer or the seed islands may be a material favoring the growth of a wire according to the N polarity.

The wire growth method may be a method such as chemical vapor deposition (CVD) or metal-organic chemical vapor deposition (MOCVD), also known as metal-organic vapor phase epitaxy (MOVPE). However, methods such as molecular-beam epitaxy (MBE), gas-source MBE (GSMBE), metal-organic MBE (MOMBE), plasma-assisted MBE (PAMBE), atomic layer epitaxy (ALE), or hydride vapor phase epitaxy (HYPE) may be used. Further, electrochemical processes may be used, for example, chemical bath deposition (CBD), hydrothermal processes, liquid aerosol pyrolysis, or electrodeposition.

As an example, the wire growth method may comprise injecting into a reactor a precursor of a group-III element and a precursor of a group-V element. Examples of precursors of group-III elements are trimethylgallium (TMGa), triethylgallium (TEGa), trimethylindium (TMIn), or trimethylaluminum TMal). Examples of precursors of group-V elements are ammonia ($NH_3$), tertiarybutylphosphine (TBP), arsine ($AsH_3$), or unsymmetrical dimethylhydrazine (UDMH).

According to an embodiment of the invention, in a first phase of growth of the wires of the III-V compound, a precursor of an additional element is added in excess, in addition to the precursors of the III-V compound. The additional element may be silicon (Si). An example of a precursor of silicon is silane ($SiH_4$).

Figure 1:
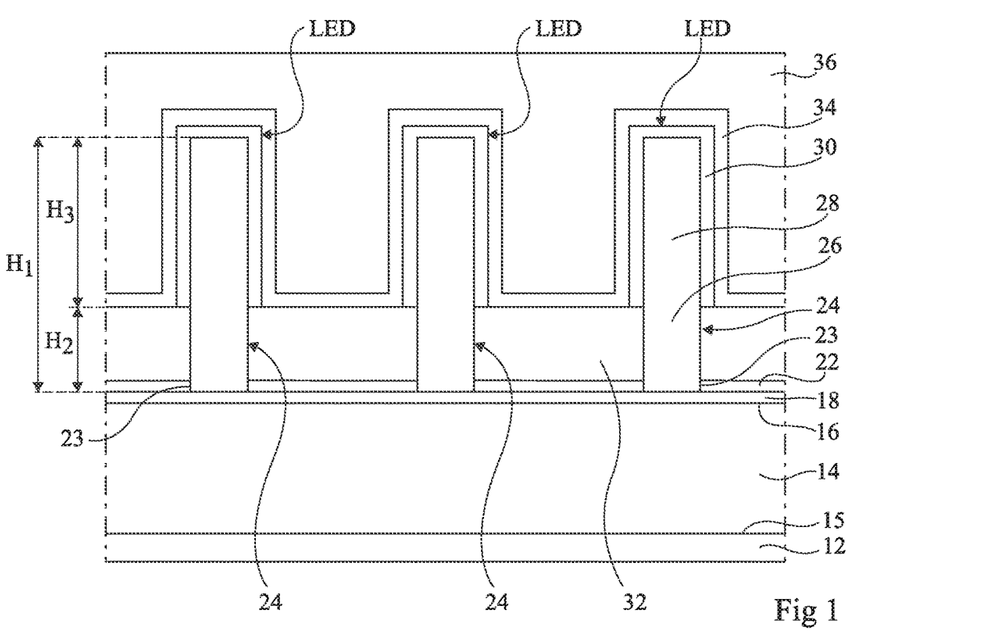
FIG. 1 is a partial simplified cross-section view of an example of an optoelectronic device comprising microwires or nanowires.

FIG. 1 is a partial simplified cross-section view of an example of an optoelectronic device 10 formed from wires such as previously described and capable of emitting an electromagnetic radiation.

Device 10 comprises, from bottom to top in FIG. 1:
a first biasing electrode 12;
a semiconductor substrate 14 comprising opposite surfaces 15 and 16, surface 15 being in contact with electrode 12;
a seed layer 18 favoring the growth of wires and arranged on surface 16;
an insulating layer 22 extending on seed layer 18 and comprising openings 23 which each expose a portion of seed layer 18;
wires 24 (three wires being shown) of height $H_1$, each wire 24 being in contact with seed layer 18, each wire 24 comprising a lower portion 26, of height $H_2$, in contact with seed layer 18 and an upper portion 28, of height $H_3$, continuing lower portion 26;
a shell 30 comprising a stack of semiconductor layers covering each upper portion 28;
an insulating portion 32 extending on layer 22 between wires 24 up to height $H_2$;
a second electrode layer 34 covering each shell 30 and extending on insulating portion 32; and
an encapsulation layer 36 covering second electrode layer 34.

Shell 30 particularly comprises an active layer which is the layer from which most of the electromagnetic radiation provided by device 10 is emitted. The assembly formed by each wire 24 and the associated shell 30 forms a light-emitting diode LED.

Light is emitted by each light-emitting diode LED in all directions from shell 30. Only the light escaping from optoelectronic device 10 by crossing encapsulation layer 36 can be seen by an observer. However, part of the light emitted by light-emitting diodes LED is captured in wires 24 and in substrate 14 and thus cannot be perceived by an observer. The reflectivity of optoelectronic device 10 is the ratio of the quantity of light which escapes from encapsulation layer 36 to the quantity of light emitted by light-emitting diodes LED. It is desirable for the reflectivity to be the highest possible.

Thus, an object of an embodiment is to overcome at least part of the disadvantages of optoelectronic devices with light-emitting diodes, particularly with microwires or nanowires, and of their manufacturing methods, previously described.

Another object of an embodiment is to increase the reflectivity of the optoelectronic device with light-emitting diodes.

Another object of an embodiment is for light-emitting diodes made of a semiconductor material to be capable of being formed at an industrial scale and at a low cost.

Figure 2:
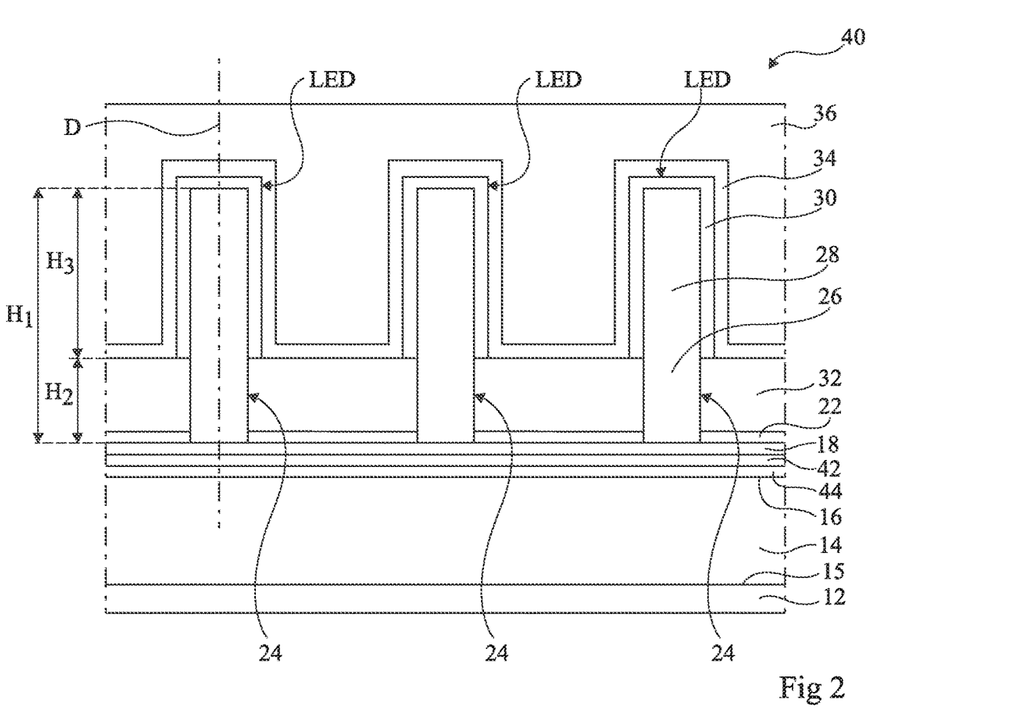
FIG. 2 is a partial simplified cross-section view of an embodiment of an optoelectronic device with microwires or nanowires having an improved reflectivity.

FIG. 2 is a partial simplified cross-section view of an embodiment of an optoelectronic device 40 formed from wires such as previously described and capable of emitting an electro-magnetic radiation.

Optoelectronic device 40 comprises all the elements of optoelectronic device 10 previously described in relation with FIG. 1 and further comprises a layer 42, called mirror layer hereafter, located under seed layer 18 and capable of increasing the reflectivity of device 40. Optoelectronic device 40 may further comprise a protection layer 44 interposed between substrate 14 and mirror layer 42.

According to the present embodiment, the materials forming seed layer 18 and mirror layer 42 and the thicknesses of seed layer 18 and of mirror layer 42 are selected to increase the reflectivity of optoelectronic device 40.

The complex optical index, also called complex refraction index, is a dimensionless number which characterizes the optical properties of a medium, particularly the absorption and the diffusion.

The refraction index is equal to the real part of the complex optical index. The extinction coefficient, also called attenuation coefficient, measures the energy loss of an electro-magnetic radiation crossing this material. The extinction coefficient is equal to the opposite of the imaginary part of the complex refraction index. The refraction index and the extinction coefficient of a material may be determined, for example, by ellipsometry. A method of analyzing ellipsometric data is described in the work entitled "Spectroscopic ellipsometry, Principles and Applications" by Hiroyuki Fujiwara, published by John Wiley & Sons, Ltd (2007).

Preferably, the material forming mirror layer 42 is electrically conductive.

According to an embodiment, the thickness of mirror layer 42, noted $e_{mirror}$, is greater than 15 nm.

According to an embodiment, the refraction index of mirror layer 42, noted $n_{mirror}$, is smaller than or equal to 2 for a wavelength in the range from 380 nm to 650 nm.

According to an embodiment, the extinction coefficient of mirror layer 42, noted $k_{mirror}$, is smaller than or equal to 3 for a wavelength in the range from 380 nm to 650 nm.

As an example, the material forming mirror layer 40 may be chromium, rhodium, ruthenium, palladium, or an alloy of two of these compounds or of more than two of these compounds.

According to an embodiment, the thickness of the seed layer, noted $e_{CN}$, is smaller than or equal to 20 nm.

According to an embodiment, the refractive index of seed layer 18, noted $n_{CN}$, is in the range from 1 to 3 for a wavelength in the range from 380 nm to 650 nm.

According to an embodiment, the extinction coefficient of seed layer 18, noted $k_{CN}$, is smaller than or equal to 1.5 for a wavelength in the range from 380 nm to 650 nm.

As an example, the material forming seed layer 18 may be a nitride, a carbide, or a boride of a transition metal from column IV, V, or VI of the periodic table of elements or a combination of these compounds. As an example, seed layer 18 may be made of aluminum nitride (AlN), boron (B), boron nitride (BN), titanium (Ti), titanium nitride (TiN), tantalum (Ta), tantalum nitride (TaN), hafnium (Hf), hafnium nitride (HfN), niobium (Nb), niobium nitride (NbN), zirconium (Zr), zirconium borate ($ZrB_2$), zirconium nitride (ZrN), silicon carbide (SiC), tantalum carbonitride (TaCN), magnesium nitride in $Mg_xN_y$ form, where x is approximately equal to 3 and y is approximately equal to 2, for example, magnesium nitride in $Mg_3N_2$ form or magnesium gallium nitride (MgGaN), tungsten (W), tungsten nitride (WN), or a combination thereof.

Protection layer 44, possibly present, enables to avoid a modification of the material forming mirror layer 42 by the material forming substrate 14, particularly during the steps of manufacturing wires 24. As an example, when substrate 14 is made of silicon and wires 24 are made of GaN, protection layer 44 enables to avoid the siliciding of the material forming mirror layer 42 during the steps of growth of wires 24 which may comprise steps carried out at temperatures in the order of 1,000° C.

According to an embodiment, the thickness of protection layer 44 is in the range from 1 nm to 50 nm. Protection layer 44 may be made of the same materials as seed layer 18.

Substrate 14 for example is a semiconductor substrate, such as a silicon substrate. Substrate 14 is doped with a first conductivity type, for example, N-type doped. Surfaces 15 and 16 may be planar and parallel. Surface 16 of substrate 14 may be a <100> surface. Seed layer 18 may be doped with the same conductivity type as the substrate or with the opposite conductivity type.

Electrode 12 may correspond to a conductive layer which extends on surface 15 of substrate 14. The material forming electrode 12 is, for example, nickel silicide (NiSi), aluminum (Al), aluminum silicide (AlSi), titanium (Ti), or titanium silicide (TiSi). This layer may be covered with another metal layer, for example, gold, copper, or eutectics (Ti/Ni/Au or Sn/Ag/Cu) in the case of a soldering.

Insulating layer 22 and insulating portion 32 may be made of a dielectric material, for example, silicon oxide ($SiO_2$), silicon nitride ($Si_xN_y$, where x is approximately equal to 3 and y is approximately equal to 4, for example, $Si_3N_4$), aluminum oxide ($Al_2O_3$), hafnium oxide ($HfO_2$), or diamond. As an example, the thickness of insulating layer 22 is in the range from 5 nm to 500 nm, for example, equal to approximately 30 nm.

Each wire 24 may have an elongated semiconductor structure along an axis D substantially perpendicular to surface 16. Each wire 24 may have an elongated cylindrical general shape with a hexagonal base. The average diameter of each wire 24 may be in the range from 50 nm to 2.5 μm and height $H_1$ of each wire 24 may be in the range from 250 nm to 50 μm.

The axes of two wires 24 may be distant by from 0.5 μm to 10 μm, and preferably from 1.5 μm to 4 μm. As an example, wires 24 may be regularly distributed. As an example, wires 24 may be distributed in a hexagonal network.

As an example, lower portion 26 of each wire 24 is mainly formed of the III-N compound, for example, gallium nitride, doped with the first conductivity type, for example, with silicon. The periphery of lower portion 26 may be covered with a dielectric layer, for example, SiN, up to height $H_2$ from the end of lower portion 26 in contact with seed layer 18. Height $H_2$ may be in the range from 100 nm to 25 μm. This dielectric layer may have a thickness between one atomic monolayer and 100 nm, preferably between one atomic monolayer and 10 nm.

Upper portion 28 of each wire 24 is for example at least partly made of a III-N compound, for example, GaN. Upper portion 28 may have a doping of the first conductivity type, or may not be intentionally doped. Upper portion 28 extends up to height $H_3$, which may be in the range from 100 nm to 25 μm.

In the case of a wire mainly made of GaN, the crystal structure of the wire may be of wurtzite type, the wire extending along axis C. The crystal structure of the wire may also be of cubic type.

Shell 30 may comprise a stack of an active layer covering upper portion 28 of the associated wire 24 and of a bonding layer between the active layer and electrode 34.

The active layer is the layer from which most of the radiation provided by device 40 is emitted. According to an example, the active layer may comprise confinement means, such as multiple quantum wells. It is for example formed of an alternation of GaN and of InGaN layers having respective thicknesses from 5 to 20 nm (for example, 8 nm) and from 1 to 10 nm (for example, 2.5 nm). The GaN layers may be doped, for example of type N or P. According to another example, the active layer may comprise a single InGaN layer, for example, having a thickness greater than 10 nm.

The bonding layer may correspond to a semiconductor layer or to the stack of semiconductor layers and enables to form a P-N or P-I-N junction with the active layer and/or upper portion 28. It enables to inject holes into the active layer via electrode 34. The stack of semiconductor layers may comprise an electron barrier layer made of a ternary alloy, for example, aluminum gallium nitride (AlGaN) or aluminum indium nitride (AlInN) in contact with the active layer and an additional layer, to provide a good electric contact between second electrode 34 and the active layer, for example, made of gallium nitride (GaN) in contact with the electron barrier layer and with electrode 34. The bonding layer may be doped with the conductivity type opposite to that of portion 28, for example, P-type doped.

Second electrode 34 is capable of biasing the active layer of each wire 24 and of letting through the electromagnetic radiation emitted by wires 24. The material forming electrode 34 may be a transparent conductive material such as indium-tin oxide (or ITO), aluminum zinc oxide, or graphene.

Encapsulation layer 36 may be made of silica ($SiO_2$).

Figure 3:
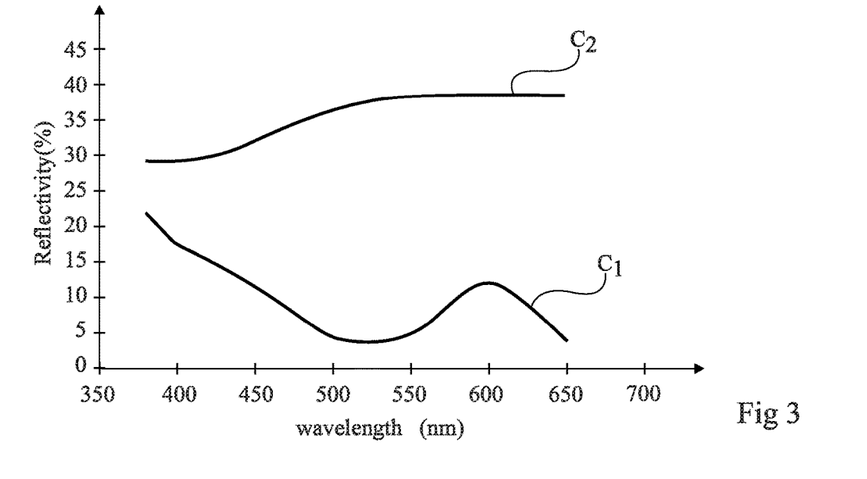
FIG. 3 shows curves of the variation, according to the wavelength, of the reflectivity of the optoelectronic devices of FIGS. 1 and 2 under each microwire or nanowire.

FIG. 3 shows variation curves $C_1$ and $C_2$ respectively of the reflectivity of optoelectronic device 10 shown in FIG. 1 and of optoelectronic device 40 shown in FIG. 2, measured under a wire 24. Curves $C_1$ and $C_2$ have been determined by simulation by considering a stack comprising silicon substrate 14, ZnR seed layer 18 with a 10-nm thickness, and a GaN wire 24. For curve $C_1$, mirror layer 42 is not present and for curve $C_2$, the stack further comprises chromium mirror layer 42 with a 40-nm thickness. When mirror layer 42 is present, an increase by at least 30% of the reflectivity has been obtained for a wavelength in the range from 380 nm to 650 nm. Advantageously, curve $C_2$ increases monotonously for a wavelength in the range from 380 nm to 650 nm. The reflectivity thus increases with the wavelength. This is advantageous since the light emission efficiency of the optoelectronic device may decrease with the wavelength. The increase of the reflectivity with the wavelength thus enables to at least partially compensate for the decrease of the emission efficiency with the wavelength.

Figure 4:
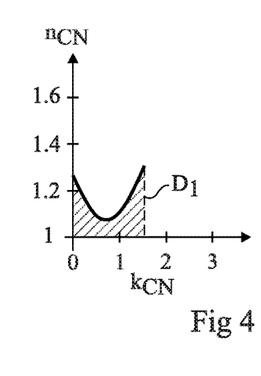
FIG. 4 shows a domain of refraction indexes and of extinction coefficients of the optoelectronic device of FIG. 1 for which the reflectivity is greater than 30%.

FIG. 4 shows in a hatched area domain $D_1$ of refraction indexes $n_{CN}$, in ordinates, and of extinction coefficients $k_{CN}$, in abscissas, of seed layer 18 for which the under-wire reflectivity is greater than 30% for a wavelength in the range from 380 nm to 650 nm when mirror layer 40 is not present. Domain $D_1$ has been determined by simulation with a seed layer 18 having a thickness $e_{CN}$ of 10 nm. As shown, domain $D_1$ is small, which means that, in the absence of mirror layer 42, the selection of the materials to form seed layer 18 enabling to obtain an under-wire reflectivity greater than 30% for a wavelength in the range from 380 nm to 650 nm is limited.

FIGS. 5A to 5E respectively show in hatched areas domains $D_2$, $D_3$, $D_4$, $D_5$, and $D_6$ of refraction indexes $n_{mirror}$, in ordinates, and of extinction coefficients $k_{mirror}$, in abscissas, of mirror layer 42 for which an under-wire reflectivity greater than 40% for a wavelength in the range from 380 nm to 650 nm is obtained. Domains $D_2$ to $D_6$ have been determined by simulation for different refraction indexes $n_{CN}$ and different extinction coefficients $k_{CN}$ of seed layer 18. Domains $D_2$ to $D_6$ have been determined with a seed layer 18 having a thickness $e_{CN}$ of 10 nm.

Figure 5A:
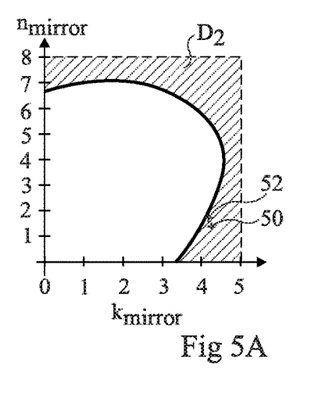
FIGS. 5A to 5E show domains of refraction indexes and of extinction coefficients for a plurality of optoelectronic devices of FIG. 2 for which the reflectivity is greater than 40%.
Figure 5B:
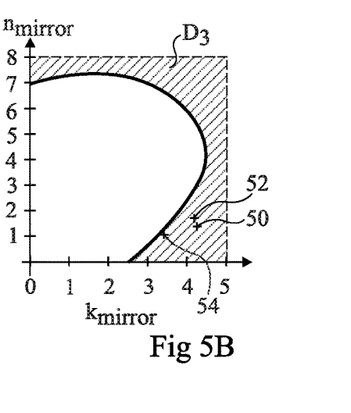
Figure 5C:
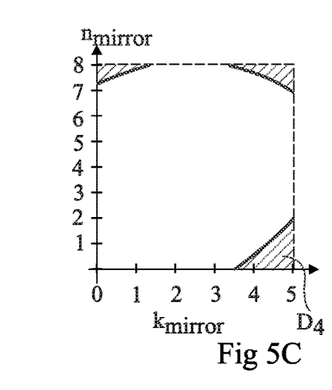
Figures 5D, 5E:
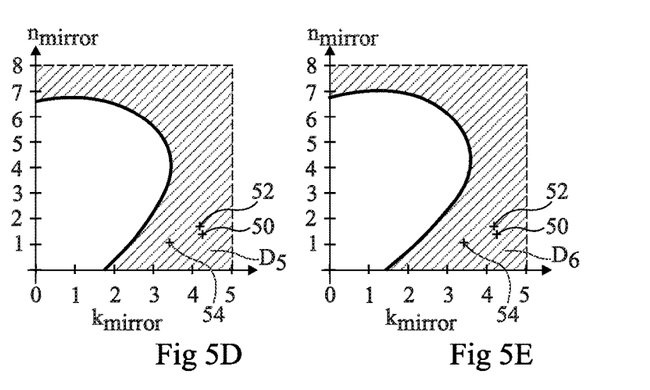

Domain $D_2$ shown in FIG. 5A has been determined with a seed layer 18 having a refraction index $n_{CN}$ equal to 2 and an extinction coefficient $k_{CN}$ equal to 1.5. Domain $D_3$ shown in FIG. 5B has been determined with a seed layer 18 having a refraction index $n_{CN}$ equal to 2 and an extinction coefficient $k_{CN}$ equal to 0.5. Domain $D_4$ shown in FIG. 5C has been determined with a seed layer 18 having a refraction index $n_{CN}$ equal to 3 and an extinction coefficient $k_{CN}$ equal to 0.5. Domain $D_5$ shown in FIG. 5D has been determined with a seed layer 18 having a refraction index $n_{CN}$ equal to 1 and an extinction coefficient $k_{CN}$ equal to 1.5. Domain $D_6$ shown in FIG. 5E has been determined with a seed layer 18 having a refraction index $n_{CN}$ equal to 2 and an extinction coefficient $k_{CN}$ equal to 0.5.

The inventors have selected the materials of strong extinction coefficients which belong to domains $D_2$ to $D_6$ of refraction indexes $n_{mirror}$ and of extinction coefficients $k_{mirror}$ of mirror layer 42 for which an under-wire reflectivity greater than 40% for a wavelength in the range from 380 nm to 650 nm is obtained. These are metals or metal alloys which have a refraction index smaller than or equal to 2 and an extinction coefficient greater than or equal to 3. As an example, in FIGS. 5A, 5B, 5D, and 5E, cross 50 represents rhodium, cross 52 represents chromium, and cross 54 represents palladium.

Figure 6:
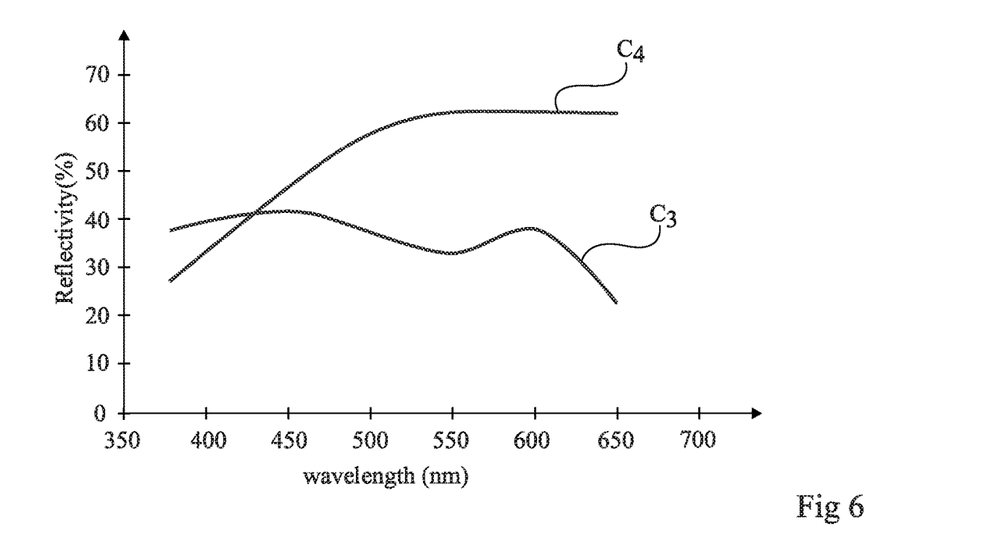
FIGS. 6 and 7 each show curves of the variation, according to the wavelength, of the reflectivity of the optoelectronic devices of FIGS. 1 and 2 between two adjacent microwires or nanowires.

FIG. 6 shows variation curves $C_3$ and $C_4$ respectively of the reflectivity of optoelectronic device 10 shown in FIG. 1 and of optoelectronic device 40 shown in FIG. 2, measured between two adjacent wires 24. Curves $C_3$ and $C_4$ have been determined by simulation by considering a stack comprising silicon substrate 14, ZrN seed layer 18 with a 10-nm thickness, dielectric layer 22, and insulating portion 32 made of $SiO_2$ with a total thickness of 80 nm, ITO electrode layer 34 with a 80-nm thickness, and encapsulation layer 36 made of $SiO_2$ with a 10-µm thickness. For curve $C_3$, mirror layer 42 is not present and for curve $C_4$, the stack further comprises chromium mirror layer 42 with a 40-nm thickness. In the presence of mirror layer 42, an average increase by at least 40% of the reflectivity has been obtained for a wavelength in the range from 380 nm to 650 nm. Advantageously, curve $C_4$ increases monotonously for a wavelength in the range from 380 nm to 650 nm. The reflectivity thus increases with the wavelength.

Figure 7:
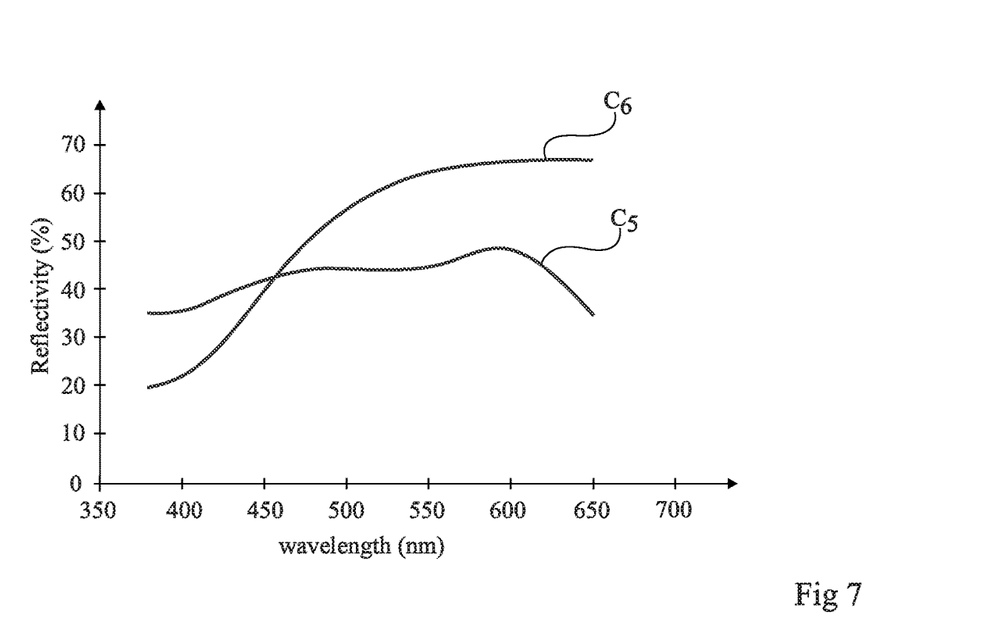

FIG. 7 shows variation curves $C_5$ and $C_6$ respectively of the reflectivity of optoelectronic device 10 shown in FIG. 1 and of optoelectronic device 40 shown in FIG. 2, measured between two adjacent wires 24. As compared with curves $C_3$ and $C_4$, curves $C_5$ and $C_6$ have been determined by simulation by considering that dielectric layer 22 and insulating portion 32 have a total thickness of 40 nm and that electrode layer 34 has a 90-nm thickness. These thicknesses have been determined to obtain the maximum reflectivity at the 650-nm wavelength. In the presence of mirror layer 42, an average increase by at least 18% of the reflectivity has been obtained for a wavelength in the range from 380 nm to 650 nm. Advantageously, curve $C_6$ increases monotonously for a wavelength in the range from 380 nm to 650 nm. The reflectivity thus increases with the wavelength.

Further, FIGS. 6 and 7 illustrate the fact that the general shape of the curve of variation of the reflectivity, particularly the increase of the reflectivity with the wavelength, is obtained independently from the thicknesses of the layers of the optoelectronic device.

An embodiment of the manufacturing method of optoelectronic device 40 comprises the steps of:

(1) Successively depositing on substrate 14 protection layer 44, mirror layer 42, and seed layer 18. Protection layer 44 may be absent. Mirror layer 42 may be obtained by a CVD or physical vapor deposition (PVD) method.

Seed layer 18, and possibly protection layer 44, may be obtained by a MOCVD-type method. However, methods such as CVD, MBE, GSMBE, MOMBE, ALE, HYPE, ALD (Atomic Layer Deposition), evaporation, or reactive cathode sputtering may be used, as well as any deposition type providing a textured layer. When seed layer 18 is made of aluminum nitride, it may be substantially textured and have a preferred biasing. The texturing of layer 18 may be obtained by an additional treatment carried out after the deposition of seed layer 18. It for example is an anneal under an ammonia flow ($NH_3$).

(2) Depositing layer 22 of a dielectric material on seed layer 18. Layer 22 is made of a dielectric material which may be selectively etched over the material forming seed layer 18. The dielectric material is, for example, silicon nitride (for example, $Si_3N_4$) or silicon oxide ($SiO_2$).

(3) Etching openings 23 in dielectric layer 22 to expose areas of seed layer 18. The etching of openings 23 may be performed by a selective etching step which causes no etching of seed layer 18. It may be an ion etching or a reactive ion etching.

(4) Growing passivated portion 26 of each wire 24 up to height $H_2$. Each wire 24 grows from seed layer 18. Lower portion 26 of each wire 24 may be obtained by a MOCVD-type method. However, methods such as CVD, MBE, GSMBE, MOMBE, PAMBE, ALE, HVPE, or electrochemical methods may be used.

As an example, in the case where upper portion 26 is made of heavily-doped N-type GaN, a MOCVD-type method may be implemented by injection into a MOCVD reactor, of shower type, of a gallium precursor gas, for example, trimethylgallium (TMGa) and of a nitrogen precursor gas, for example, ammonia ($NH_3$). As an example, a showerhead-type 3×2" MOCVD reactor commercialized by AIXTRON, may be used. A molecular flow ratio between trimethylgallium and ammonia within the 5-200 range, preferably within the 10-100 range, enables to favor the growth of wires. As an example, a carrier gas which ensures the diffusion of metal-organic elements all the way into the reactor charges with metal-organic elements in a TMGa bubbler. The latter is adjusted according to the standard operating conditions. A flow of 60 sccm (standard cubic centimeters per minute) is for example selected for TMGa, while a 300-sccm flow is used for $NH_3$ (standard $NH_3$ bottle). A pressure of approximately 800 mbar (800 hPa) is used. The gaseous mixture further comprises silane injected into the MOCVD reactor, which material is a precursor of silicon. The silane may be diluted in hydrogen at 1,000 ppm and a 20-sccm flow is provided. The temperature in the reactor is for example in the range from 950° C. to 1,100° C., preferably from 990° C. to 1,060° C. To transport species from the outlet of the bubblers to the two reactor plenums, a 2,000-sccm flow of carrier gas, for example, $N_2$, distributed between the two plenums, is used. The previously-indicated gas flows are given as an indication and should be adapted according to the size and to the specificities of the reactor.

The presence of silane among the precursor gases results in an incorporation of silicon within the GaN compound. A lower N-type doped portion 26 is thus obtained. This further translates as the forming of a silicon nitride layer which covers the periphery of portion 26 of height $H_2$, except for the top, as portion 26 grows.

(5) Growing upper portion 28 of height $H_3$ of each wire 24 on the top of lower portion 26. For the growth of upper portion 28, the previously-described operating conditions of the MOCVD reactor are, as an example, maintained but for the fact that the silane flow in the reactor is decreased, for example, by a factor greater than or equal to 10, or stopped. Even when the silane flow is stopped, upper portion 28 may be N-type doped due to the diffusion in this active portion of dopants originating from the adjacent passivated portions or due to the residual doping of GaN.

(6) Forming by epitaxy, for each wire 24, the layers forming shell 30. Given the presence of the passivating portion covering the periphery of lower portion 26, the deposition of the layers forming shell 30 only occurs on upper portion 28 of wire 24;

(7) Forming insulating portion 32, for example, by conformal deposition of an insulating layer and etching of this insulating layer to expose shells 30 of wires 24; and (8) Forming electrodes 34 and 12.

Specific embodiments of the present invention have been described. Various alterations and modifications will occur to those skilled in the art. In particular, although the drawings show embodiments where the wires, covered with a first electrode, are formed on a first surface of a support while a second electrode is formed on a second surface of the support, opposite to the first surface, it should be clear that the second electrode may be provided on the side of the first surface.

Further, although, in the previously-described embodiments, each wire 24 comprises a passivated portion 26, at the base of the wire in contact with seed layer 18, passivated portion 26 may be absent.

Further, although embodiments have been described for an optoelectronic device comprising a mirror layer 42 entirely covering substrate 14, it should be clear that mirror layer 42 may be replaced with portions, of the same material as mirror layer 42, provided at least under each wire 24 and/or provided between adjacent wires 24.

Further, although embodiments have been described for an optoelectronic device comprising a seed layer 18 entirely covering mirror layer 42, it should be clear that seed layer 18 may be replaced with seed islands provided under each wire 24.

Further, although embodiments have been described for an optoelectronic device for which shell 30 covers the top of the associated wire 24 and a portion of the lateral sides of wire 24, it is possible to only provide the shell at the top of wire 24.

The invention claimed is:

1. A method of manufacturing an optoelectronic device, comprising successive steps of:
    forming, on a substrate, a first layer or first portions, the first layer or the first portions having a thickness greater than or equal to 15 nm and comprising a first material having an extinction coefficient greater than or equal to 3 for any wavelength in the range from 380 nm to 650 nm;
    forming a second layer or second portions covering the first layer or the first portions, the second layer or the second portions having a thickness smaller than or equal to 20 nm and comprising a second material having a refraction index in the range from 1 to 3 and an extinction coefficient smaller than or equal to 1.5 for any wavelength in the range from 380 nm to 650 nm; and
    forming light-emitting diodes (LED) comprising wire, conical, or frustoconical semiconductor elements in contact with the second layer or with the second portions, the first layer or the first portions being interposed between the substrate and the semiconductor elements,
    wherein the second material comprises a nitride, a carbide, a boride of a transition metal of column IV, V, or VI of the periodic table of elements, or any combination thereof; or
    wherein the second material comprises aluminum nitride (AlN), boron (B), boron nitride (BN), titanium (Ti), titanium nitride (TiN), tantalum (Ta), tantalum nitride (TaN), hafnium (Hf), hafnium nitride (HfN), niobium (Nb), niobium nitride (NbN), zirconium (Zr), zirconium borate ($ZrB_2$), zirconium nitride (ZrN), silicon carbide (SiC), tantalum carbonitride (TaCN), magnesium nitride in $Mg_xN_y$ form, where x is approximately equal to 3 and y is approximately equal to 2, magnesium gallium nitride (MgGaN), tungsten (W), tungsten nitride (WN) or any combination thereof.

2. The method of claim 1, wherein the first material is selected from the group comprising chromium, rhodium, ruthenium, palladium, or an alloy of two of these compounds or of more than two of these compounds.

3. The method of claim 1, wherein each semiconductor element comprises a microwire or a nanowire.

4. The method of claim 1, wherein the substrate is made of a third semiconductor material selected from the group comprising silicon, germanium, silicon carbide, a III-V compound, a II-VI compound, and a combination of these compounds.

5. The method of claim 1, wherein each semiconductor element comprises at least a portion mainly comprising a fourth semiconductor material in contact with the second layer or one of the second portions, the fourth semiconductor material being selected from the group comprising silicon, germanium, silicon carbide, a III-V compound, a II-VI compound, and a combination of these compounds.

6. The method 1, wherein each semiconductor element is at least partially covered with a semiconductor structure capable of emitting light.

7. The method of claim 1, further comprising a third layer between the first layer or the first portions and the substrate.

8. The method of claim 7, wherein the third layer and the second layer or the second portions are made of the same material.

* * * * *

UNITED STATES PATENT AND TRADEMARK OFFICE
CERTIFICATE OF CORRECTION

PATENT NO. : 10,062,808 B2  
APPLICATION NO. : 14/901214  
DATED : August 28, 2018  
INVENTOR(S) : Bérangère Hyot and Philippe Gilet Page 1 of 1

It is certified that error appears in the above-identified patent and that said Letters Patent is hereby corrected as shown below:

On the Title Page

Item [71], should read:  
Commissariat à l'énergie atomique et aux énergies alternatives, Paris (FR)  
--Aledia, Grenoble (FR)--

Signed and Sealed this  
Twelfth Day of February, 2019

Andrei Iancu  
*Director of the United States Patent and Trademark Office*